(12) United States Patent
Chen et al.

(10) Patent No.: US 12,740,003 B2
(45) Date of Patent: Sep. 15, 2026

(54) MULTI-NODE SERVER

(71) Applicant: PEGATRON CORPORATION, Taipei City (TW)

(72) Inventors: Po-Han Chen, Taipei City (TW); Wei-Cheng Liu, Taipei City (TW)

(73) Assignee: PEGATRON CORPORATION, Taipei City (TW)

(*) Notice: Subject to any disclaimer, the term of this patent is extended or adjusted under 35 U.S.C. 154(b) by 94 days.

(21) Appl. No.: 18/909,062

(22) Filed: Oct. 8, 2024

(65) Prior Publication Data

US 2025/0159835 A1 May 15, 2025

(30) Foreign Application Priority Data

Nov. 9, 2023 (TW) ................................ 112143149

(51) Int. Cl.
*H05K 7/14* (2006.01)
*H05K 5/02* (2006.01)

(52) U.S. Cl.
CPC ......... *H05K 7/1492* (2013.01); *H05K 5/0247* (2013.01)

(58) Field of Classification Search
CPC .......................... H05K 7/1492; H05K 7/0247
See application file for complete search history.

(56) References Cited

U.S. PATENT DOCUMENTS 6,377,471 B1 4/2002 Chong, Jr. et al.
2012/0026668 A1* 2/2012 Landon .................. G06F 1/187 361/679.31
2019/0012288 A1 1/2019 Zhao et al.
2020/0363844 A1* 11/2020 Sun .......................... G06F 1/20
2021/0349503 A1 11/2021 Patel et al.
2023/0057545 A1* 2/2023 Gao .................. H05K 7/20781

FOREIGN PATENT DOCUMENTS

| | | | |
|---|---|---|---|
| CN | 106774763 | A | 5/2017 |
| CN | 110018721 | A | 7/2019 |
| CN | 116723198 | A | 9/2023 |
| CN | 116991783 | A | 11/2023 |
| TW | I518521 | B | 1/2016 |
| WO | WO2013131374 | A1 | 9/2013 |

OTHER PUBLICATIONS

European Patent Office, Search Report issued on Apr. 4, 2025 for EP application No. 24208334.3.

* cited by examiner

*Primary Examiner* — Jerry Wu
(74) *Attorney, Agent, or Firm* — Li & Cai Intellectual Property (USA) Office

(57) ABSTRACT

A multi-node server includes a server chassis, a main circuit board, a power delivery circuit board, and a signal transfer module. The main circuit board has a first node area and a second node area. The power delivery circuit board is disposed vertically on the main circuit board. A first side of the power delivery circuit board has a first power input connector and a second power input connector. A second side of the power delivery circuit board has a first power output connector facing the first node area and a second power output connector facing the second node area. The signal transfer module has a signal transfer circuit board, a first signal connector, and a second signal connector. The signal transfer circuit board is parallel to the main circuit board. The signal transfer circuit board electrically connects the first signal connector to the second signal connector.

13 Claims, 6 Drawing Sheets

FIG. 1

MULTI-NODE SERVER

CROSS-REFERENCE TO RELATED PATENT APPLICATION

This application claims the benefit of priorities to Taiwan Patent Application No. 112143149, filed on Nov. 9, 2023. The entire content of each of the above identified applications is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a multi-node server, and more particularly to a server with two or more nodes.

BACKGROUND OF THE DISCLOSURE

Currently, common types of servers include single-node server and multi-node server. A node is a basic unit in data structures that stores and processes data. Types of nodes include, for example, a computing node responsible for operation, a storage node responsible for storing data, a network node that connects different nodes to each other and connects this entire computing cluster to the outside world, and a control node that allows users to control the entire computing cluster.

Compared with single-node servers, multi-node servers have the replaceability and scalability of functional configurations. Currently, common multi-node servers are mostly based on central processing unit (CPU) computing nodes. Each CPU computing node can be equipped with different access interfaces (I/O Ports), storage disks, and add-on cards to meet different requirements.

If there are artificial intelligence (AI) deep computing requirements, one of the nodes can be replaced with a computing node configured with a graphic processing unit (GPU). If there are high-density storage requirements, one of the nodes can be replaced with a storage node configured with storage slots to accommodate storage hard disks. The existing single nodes allow for quick replacement, but each node operates independently and there is no signal series connection between nodes. In order to achieve the above two different functions of the nodes, one of the nodes must be spared to exclusively connected to the CPU computing node. A common method is to use signal wires for signal series connection. However, due to the length of signal wires and cable organizing design, a single node cannot achieve the function of rapid replacement.

Therefore, how to improve a multi-node server that can be rapidly replaced with another node through an improvement in structural design to overcome the above-mentioned problems, has become one of the important issues to be solved in the relevant art.

SUMMARY OF THE DISCLOSURE

In response to the above-referenced technical inadequacies, the present disclosure provides a multi-node server to be rapidly replaced with one other node.

In order to solve the above-mentioned problems, one of the technical aspects adopted by the present disclosure is to provide a multi-node server, which includes a server chassis, a main circuit board, a power delivery circuit board, and a signal transfer module. The main circuit board is disposed in the server chassis. The main circuit board has a first node area, and a second node area. The power delivery circuit board is disposed vertically on the main circuit board. A first side of the power delivery circuit board has a first power input connector and a second power input connector. A second side of the power delivery circuit board has a first power output connector, and a second power output connector. The second side faces the first side. The first power output connector faces the first node area, and the second power output connector faces the second node area. The signal transfer module includes a signal transfer circuit board, a first signal connector, and a second signal connector. The signal transfer circuit board is disposed in a direction parallel to the main circuit board. The signal transfer circuit board electrically connects the first signal connector to the second signal connector.

Therefore, the advantage of the multi-node server provided by the present disclosure is that, by using a power delivery circuit board disposed vertically on the main circuit board and a signal transfer circuit board disposed in a direction parallel to the main circuit board and capable of high-speed transmission, the maximum density configuration of server cabinets can be achieved in a 1U dual-node system architecture. Hence, a single node can be quickly replaced without increasing the length of the server chassis.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which:

FIG. 1 is a schematic perspective exploded view of a multi-node server according to the present disclosure;

DETAILED DESCRIPTION OF THE EXEMPLARY EMBODIMENTS

Figure 1:
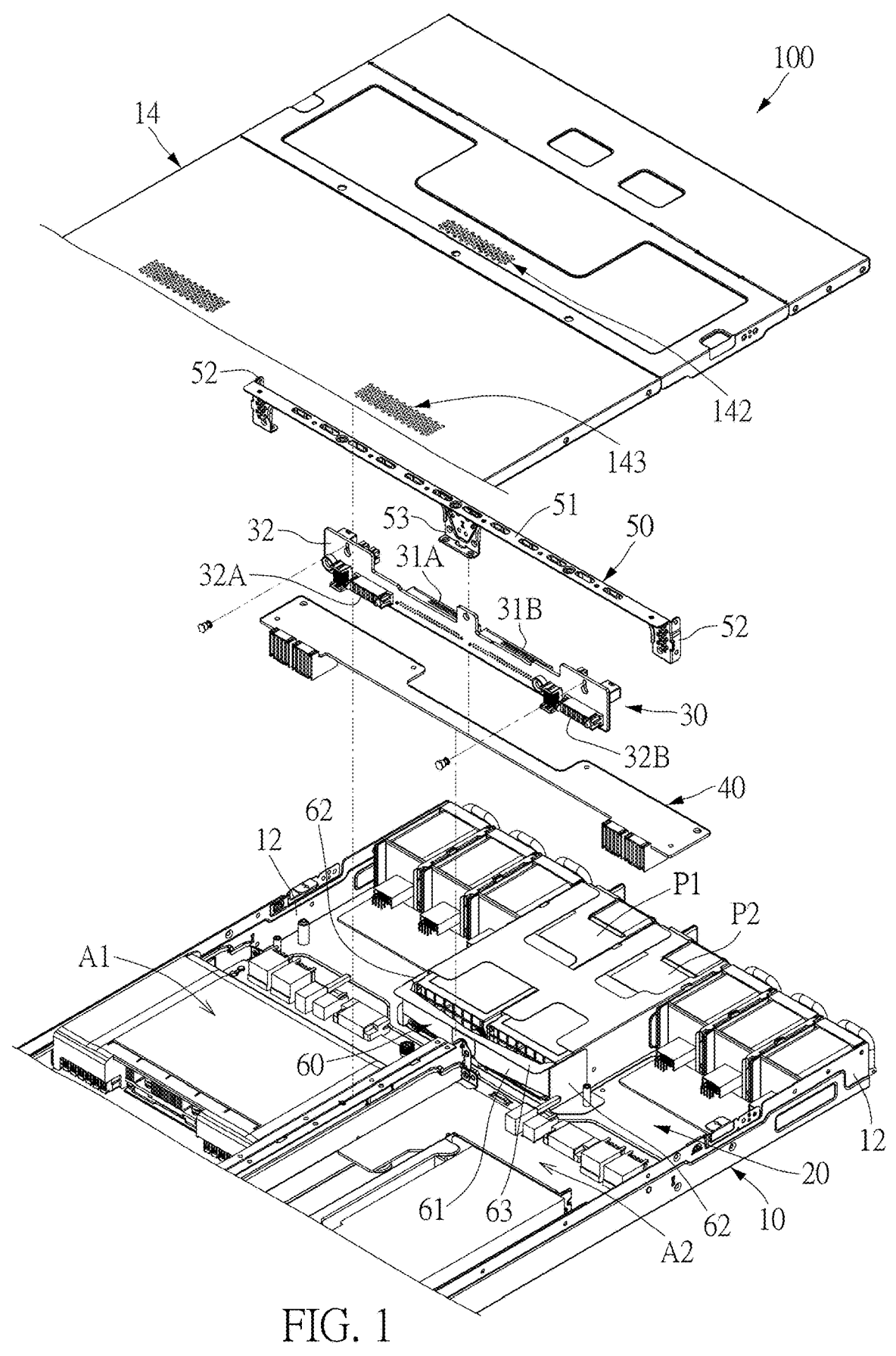
Figure 2:
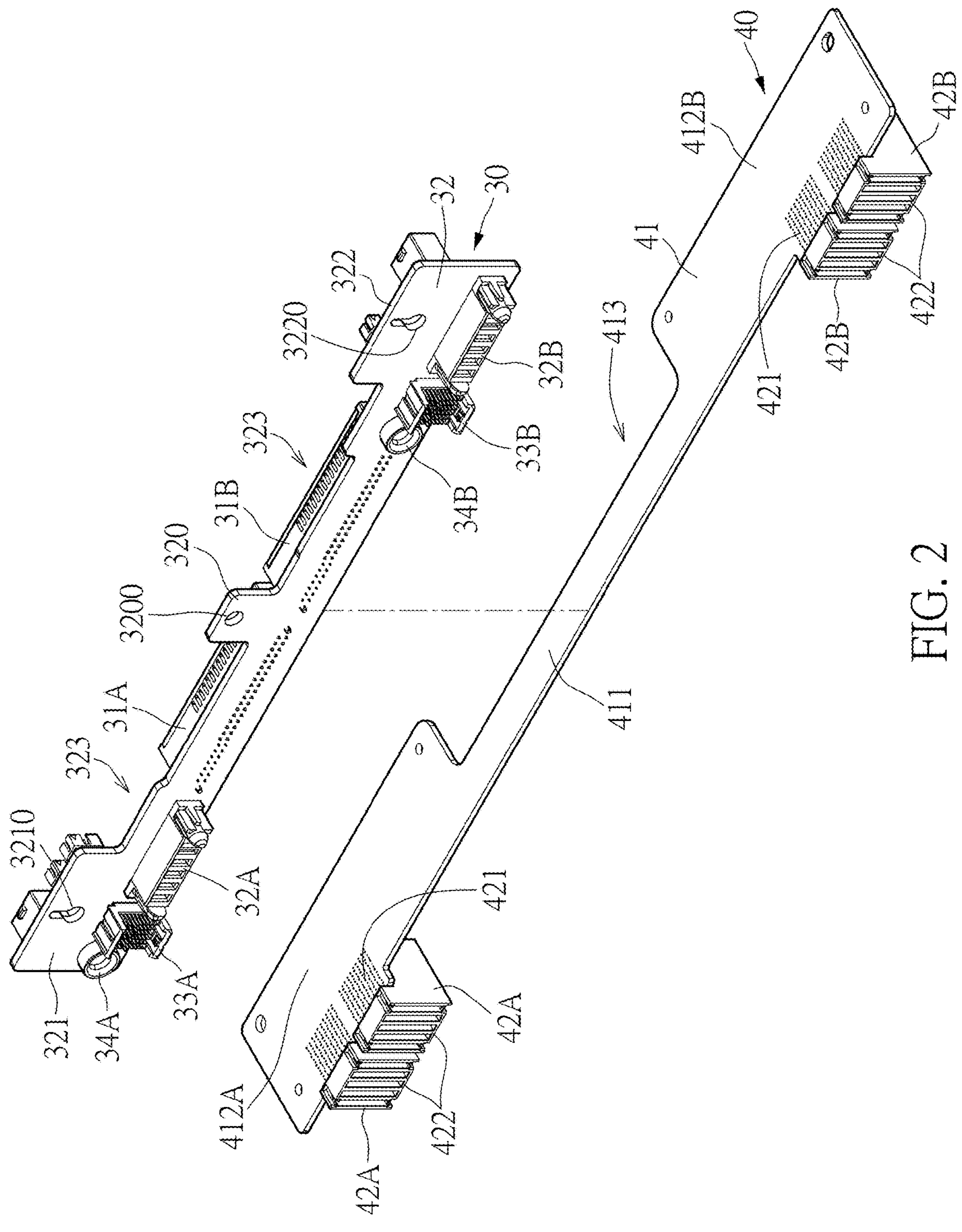
FIG. 2 is a schematic exploded view of a vertical integration circuit board module according to the present disclosure.

Referring to FIG. 1 to FIG. 5, an embodiment of the present disclosure provides a multi-node server 100 that includes a server chassis 10, a main circuit board 20, a power delivery circuit board 30, and a signal transfer module 40. The main circuit board 20 is disposed in the server chassis 10 and has at least two node areas, that is, a first node area A1, and a second node area A2. However, the present disclosure is not limited thereto. For example, one of the node areas may be used to receive a central processing unit (CPU) computing node, and the other node area may be used to receive a graphics processing unit (GPU) computing node, or a storage node. The power delivery circuit board 30 and the signal transfer module 40 may be referred to as a vertical integration circuit board module.

Figure 3:
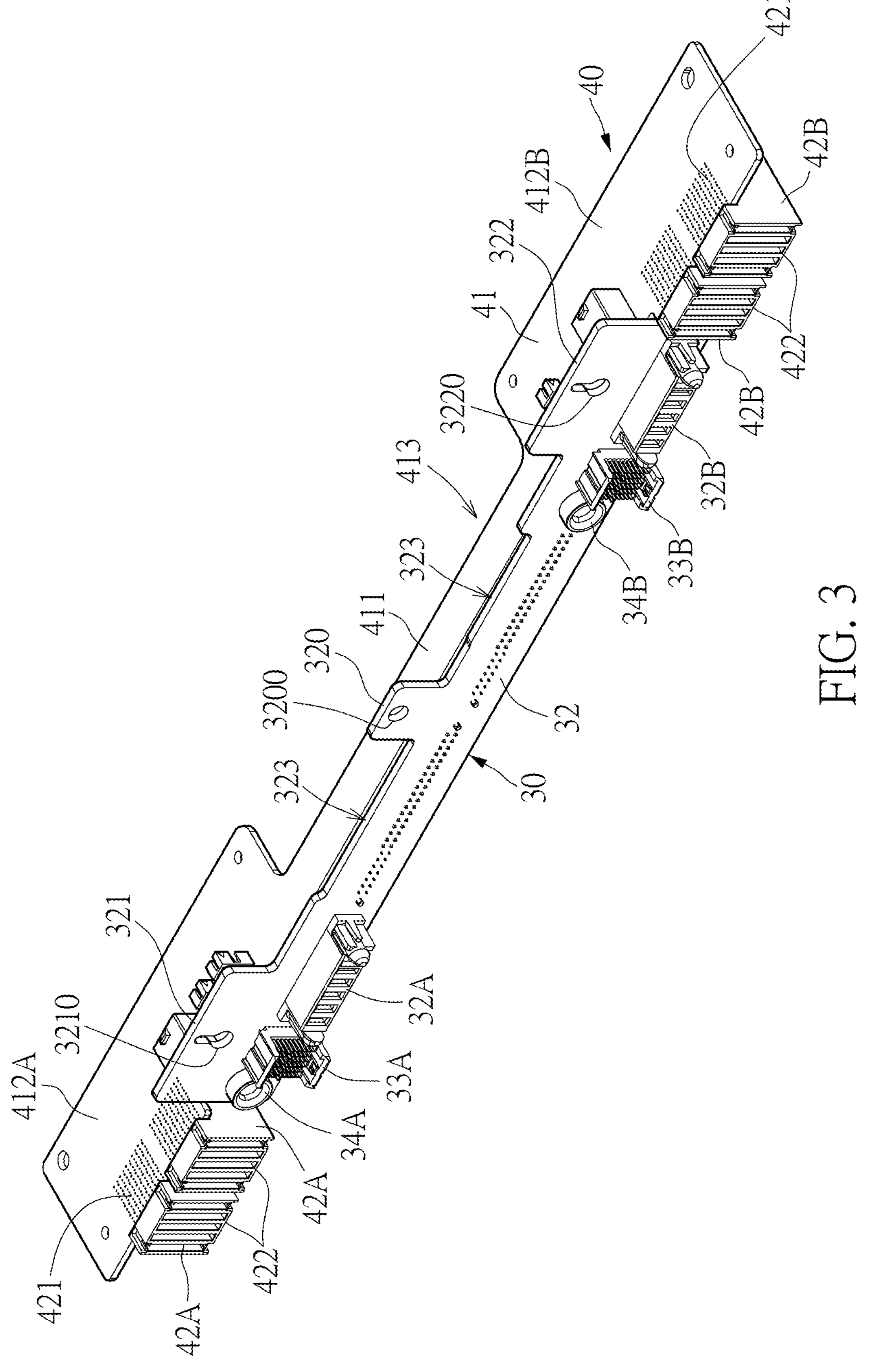
FIG. 3 is a schematic perspective assembled view of the vertical integration circuit board module according to the present disclosure.

As shown in FIG. 1 to FIG. 3, the power delivery circuit board 30 is vertically disposed on the main circuit board 20. The power delivery circuit board 30 has a first side and a second side opposite to each other. The first side refers to the side facing the power supply (P1, P2). The second side refers to the side facing away from the power supply (P1, P2), that is, facing the node area (A1, A2). The first side of the power delivery circuit board 30 has a first power input connector 31A and a second power input connector 31B.

The second side of the power delivery circuit board 30 has a first power output connector 32A and a second power output connector 32B. The first power output connector 32A faces the first node area A1, and the second power output connector 32B faces the second node area A2.

Figure 6:
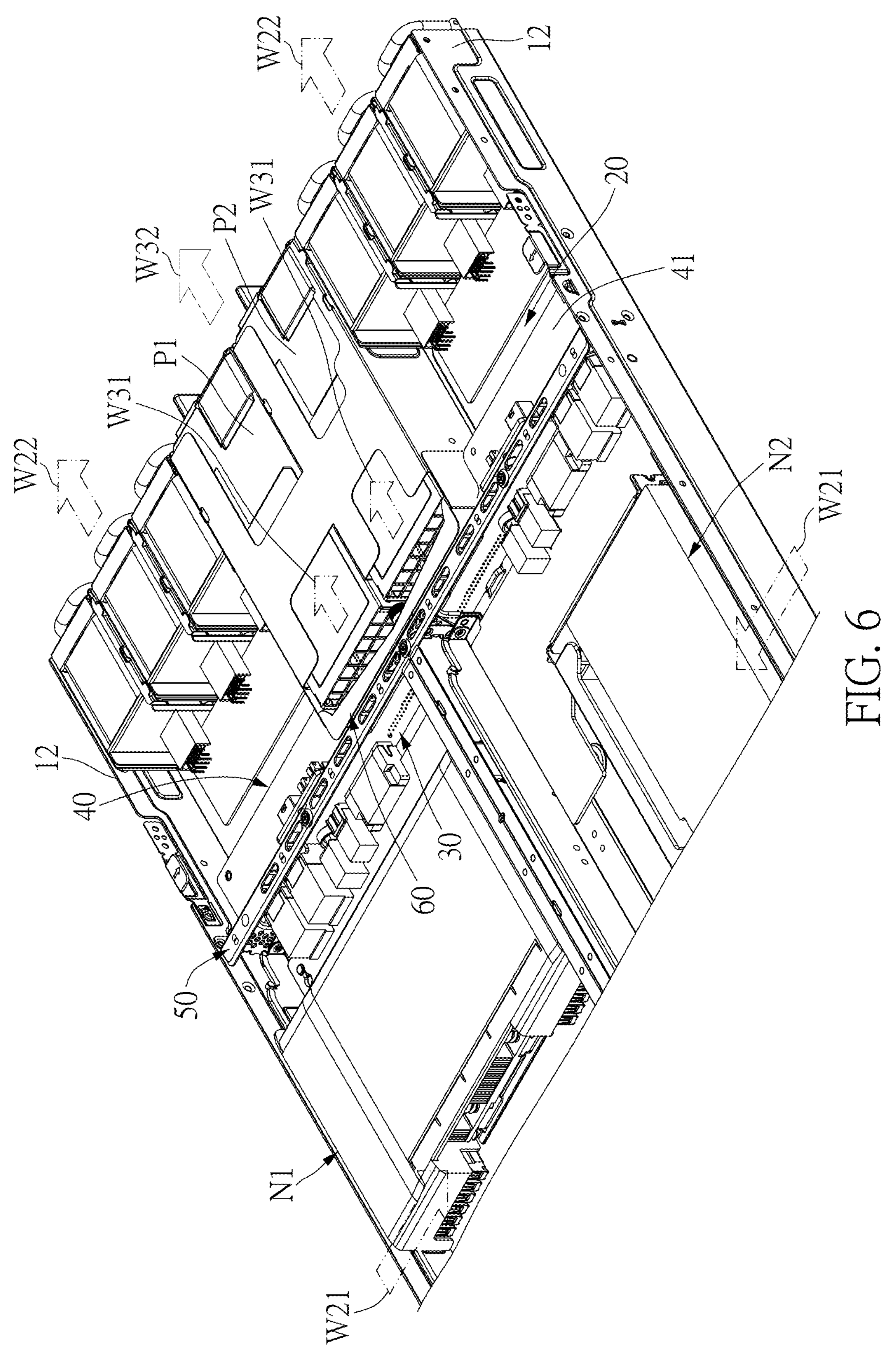
FIG. 6 is a schematic view illustrating heat-dissipating air flows of the multi-node server in FIG. 5 according to the present disclosure.

The power input connector 31A faces away from the first node area A1 and is configured to be connected to a first power supply P1 to receive power. The first power input connector 31A is connected to a first power output connector 32A and a second power output connector 32B through a board body 32 of the power delivery circuit board 30 to supply power to the first node device N1 and the second node device N2 (as shown in FIG. 6). The second power input connector 31B faces away from the second node area A2 and is configured to be connected to the second power supply P2 to receive power. Similarly, the second power input connector 31B is connected to the first power output connector 32A and the second power output connector 32B through the board body 32 of the power delivery circuit board 30 to supply power to the first node device N1 and the second node device N2 (as shown in FIG. 6). In this embodiment, a single power supply (the first power supply P1 or the second power supply P2) may simultaneously supply power to both of the first node device N1 and the second node device N2.

As shown in FIG. 2 and FIG. 3, the structure of the present embodiment is beneficial to the circulation of the cooling airflow. In detail, a top edge of the power delivery circuit board 30 is formed by a middle fixing portion 320, a first side fixing portion 321, and a second side fixing portion 322. The middle fixing portion 320 is located between the first side fixing portion 321 and the second side fixing portion 322, and a ventilation recess 323 is formed at two sides of the middle fixing portion 320, so as to facilitate the circulation of the cooling airflow in a horizontal direction. The middle fixing portion 320 is located between the first side fixing portion 321 and the second side fixing portion 322, and a ventilation recess 323 is formed on each side of the middle fixing portion 320, so as to facilitate the circulation of the cooling airflow in a horizontal direction.

As shown in FIG. 1, a fixing frame 50 is provided in this embodiment for fixing the power delivery circuit board 30. The fixing frame 50 is horizontally mounted on the server chassis 10 to provide a suspension fixing function. The fixing frame 50 has a cross frame 51, a pair of side frames 52, and a vertical frame 53. The pair of side frames 52 are connected to two ends of the cross frame 51 and are fixed to the two side walls 12 of the server chassis 10. The vertical frame 53 is located between the two side walls 12, and can be abutted against and fixed to the main circuit board 20.

Figure 4:
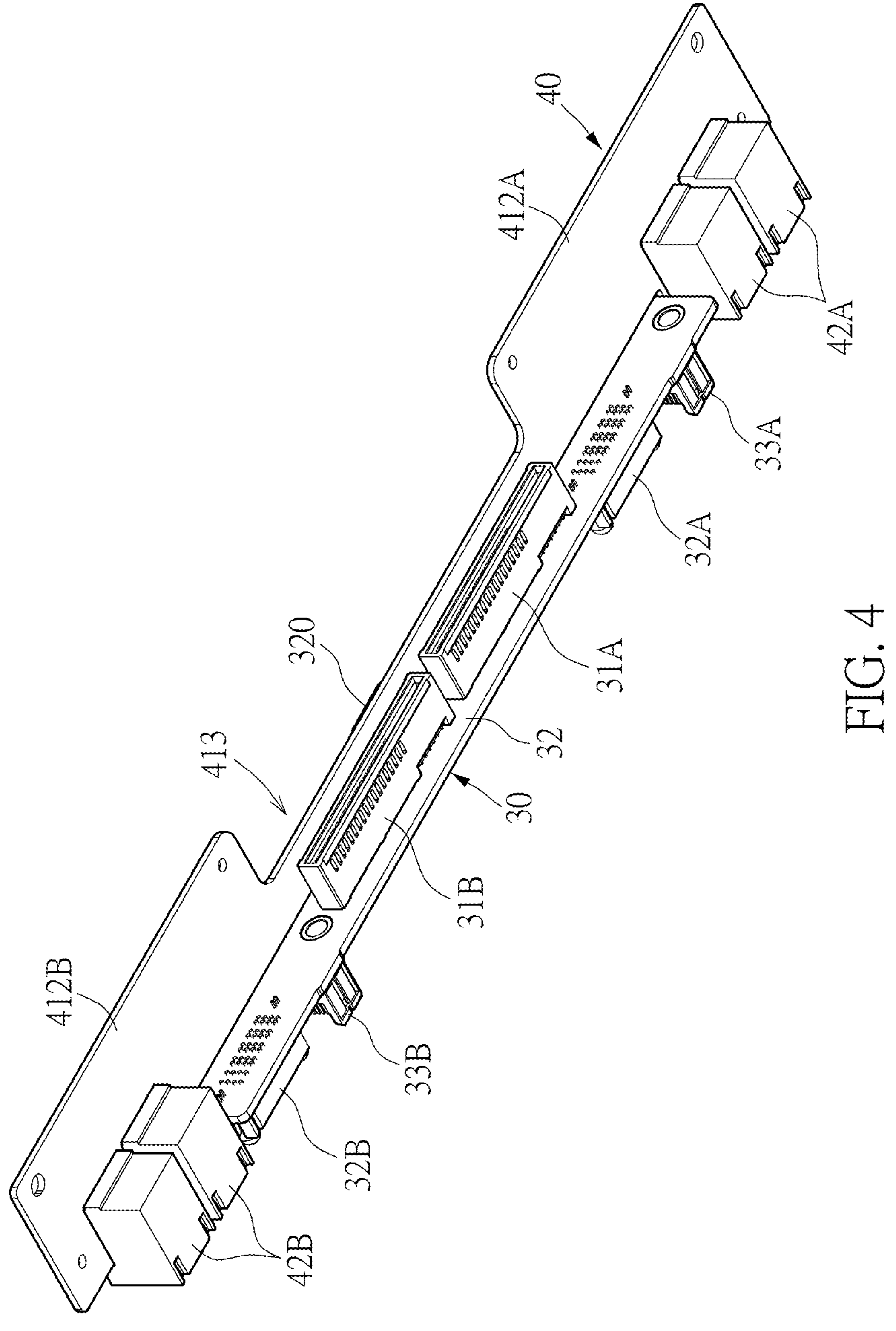
FIG. 4 is another schematic perspective assembled view of the vertical integration circuit board module according to the present disclosure.

Referring to FIG. 2 to FIG. 4, the first side fixing portion 321 has an assembly fixing hole 3210, and the second side fixing portion 322 has an assembly fixing hole 3220, which can be fixed to the cross frame 51 (as shown in FIG. 1). The middle fixing portion 320 of the power delivery circuit board 30 can be locked to the vertical frame 53.

The signal transfer module 40 includes a signal transfer circuit board 41, at least one first signal connector 42A, and at least one second signal connector 42B. The signal transfer circuit board 41 is oriented parallel to the main circuit board 20. The signal transfer circuit board 41 electrically connects the first signal connector 42A to the second signal connector 42B. One advantage of this arrangement, for example, is that there is no need to wire the two nodes, and therefore it is not limited by the length of the wire, and no wire arrangement is required. The first signal connector 42A and the second signal connector 42B of the signal transfer circuit board 41 may allow the first node device N1 and the second node device N2 to quickly be plugged and unplugged to achieve the function of quick replacement.

More specifically, as shown in FIG. 2 to FIG. 4, the signal transfer circuit board 41 has a middle section 411, a first adapter 412A, and a second adapter 412B. The middle section 411 is connected between the first adapter 412A and the second adapter 412B. A width of the middle section 411 is smaller than a width of the first adapter 412A and is smaller than a width of the second adapter 412B. The signal transfer circuit board 41 also includes a ventilation recess 413. The ventilation recess 413 is formed between the first adapter 412A and the second adapter 412B, so that the signal transfer circuit board 41 is slightly U-shaped. The width and position of the ventilation recess 413 corresponds to the first power input connector 31A and the second power input connector 31B, which facilitates cooling airflow along a vertical direction.

Referring to FIG. 1 and FIG. 6, the signal transfer circuit board 41 is disposed above the main circuit board 20 in an elevation manner. As shown in FIG. 2 and FIG. 3, the first signal connector 42A is disposed on the bottom side of the first adapter 412A, and the second signal connector 42B is disposed on the bottom side of the second adapter 412B. In this embodiment, the first signal connector 42A and the second signal connector 42B are utilized to elevate the signal transfer circuit board 41, and this structure also promotes the flow of cooling airflow. Further, the first signal connector 42A has a plug-in side 422, and the second signal connector 42B also has a plug-in side 422. The plug-in side 422 of the first signal connector 42A faces the first node area A1, and the plug-in side 422 of the second signal connector 42B faces the second node area A2. Specifically, the signal connector also has a signal terminal 421 that is substantially L-shaped, one end of which is connected upwardly to the signal relay board 41, and the other end of which is bent toward the node area.

Figure 5:
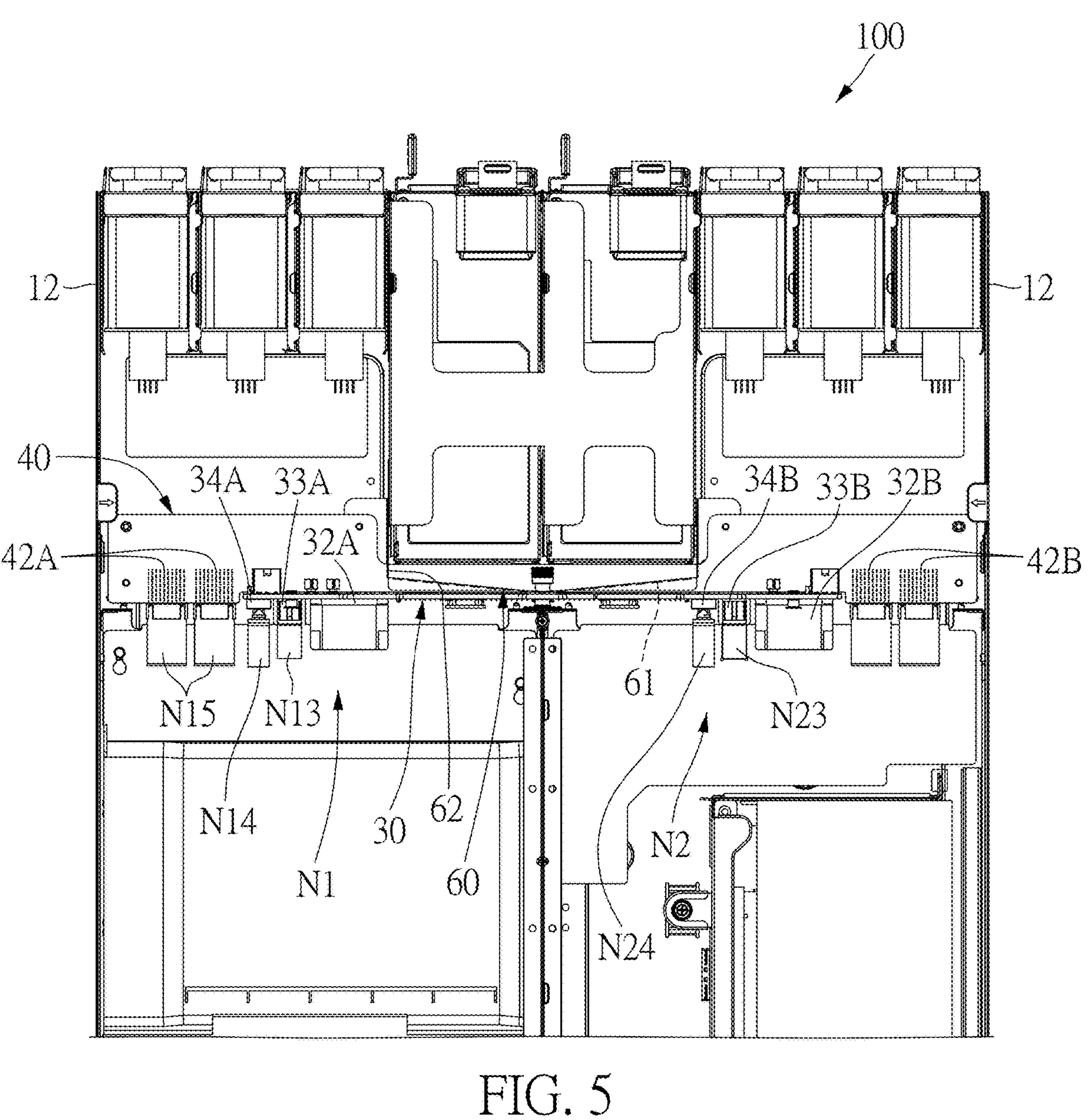
FIG. 5 is a top view of a multi-node server according to the present disclosure.

As shown in FIG. 2, FIG. 3, and FIG. 5, in this embodiment, a length of the power delivery circuit board 30 is smaller than a length of the signal transfer circuit board 41. Specifically, the power delivery circuit board 30 is located between the first signal connector 42A and the second signal connector 42B. The second side of the power delivery circuit board 30 of this embodiment also has a first identification connector 33A and a second identification connector 33B. Referring also to FIG. 5 (omitting the fixing frame 50), the first identification connector 33A is used to connect to a first identification plug N13 of a first node device N1, and the second identification connector 33B is used to connect to a second identification plug N23 of a second node device N2. The identification connector may recognize the type of device the connected node, such as a CPU computing node, or a GPU computing node, or a storage node.

As shown in FIG. 2 and FIG. 3, the second side of the power delivery circuit board 30 also has a first alignment device 34A and a second alignment device 34B. The first alignment device 34A and the second alignment device 34B of this embodiment are cylindrical, which are used to help the first node device N1 and the second node device N2 accurately insert into the power delivery circuit board 30. Referring to FIG. 5, the first alignment device 34A is connected to the first alignment plug N14 of the first node device N1, and the second alignment device 34B is connected to the second alignment plug N24 of the second node device N2.

As shown in FIG. 3, the first identification connector 33A is positioned between the first alignment device 34A and the first power input connector 31A. The second identification connector 33B is positioned between the second alignment device 34B and the second power input connector 31B.

As shown in FIG. 1 and FIG. 6, the multi-node server of the present embodiment also includes an air deflector 60, which is located on the outside of the first power input connector 31A and the second power input connector 31B. The air deflector 60 includes a curved portion 61, a pair of side shields 62, and a top shield 63. The pair of side shields 62 are connected to two sides of the curved portion 61 and are located around the cooling air inlets of the power supply units (P1, P2). The top cover 63 is disposed on the top surface of the curved portion 61, and two ends of the top cover 63 are fixed to the pair of the side shields 62.

As shown in FIG. 1, the present embodiment may form ventilation holes 142, 143 in the top shell 14 of the server chassis 10, approximately corresponding to the positions of the external airflow W21, W31 in FIG. 6 respectively. In particular, the external airflow W31 is maneuvered by the air deflector 60 to form an independent central cooling airflow W32 directly cooling the power supply (P1, P2), and therefore the cooling efficiency of the system is increased. On the other hand, the external airflow W21 on two sides can directly cool the first node area A1 and the second node area A2, and through the guidance of the air deflector 60 and the side wall 12, an independent side cooling external airflow W22 may be formed.

BENEFICIAL EFFECTS OF THE EMBODIMENTS

In conclusion, one of beneficial effects of the multi-node server is that, by using a vertical power delivery circuit board and a horizontal signal transfer circuit board for high-speed transmission, the maximum density configuration of the server cabinet can be achieved in a 1U dual-node system architecture. Hence, a single node can be quickly replaced without increasing the length and size of the server chassis.

Further, the power delivery circuit board and the signal transfer circuit board are divided into two circuit boards. The area of the power delivery circuit board that is disposed vertically on the main circuit board can be reduced so as to increase the space for heat dissipation. On the other hand, the signal transfer circuit board that is disposed in a direction parallel to the main circuit board can have less impact on the cooling airflow, and the overall cooling performance is enhanced. In addition, the high-speed signals will not be affected by the interference of the power supply, so that a more stable system performance can be provided.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A multi-node server, comprising: a server chassis; a main circuit board disposed in the server chassis, the main circuit board having a first node area and a second node area, wherein the first node area is configured to receive a first node device, and the second node area is configured to receive a second node device; a power delivery circuit board disposed vertically on the main circuit board, a first side of the power delivery circuit board having a first power input connector and a second power input connector, wherein both of the first power input connector and the second power input connector are configured to receive power; a second side of the power delivery circuit board has a first power output connector and a second power output connector, the second side facing being opposite to the first side, the first power output connector facing the first node area and being configured to receive and supply the power to the first node device, and the second power output connector facing the second node area and being configured to receive and supply the power to the second node device; and a signal transfer module including a signal transfer circuit board, a first signal connector facing the first node area, and a second signal connector facing the second node area, the signal transfer circuit board being disposed in a direction parallel to the main circuit board, and the signal transfer circuit board electrically connecting the first signal connector to the second signal connector, wherein the signal transfer board is configured to establish a signal connection between the first node device and the second node device by the first signal connector and the second signal connector respectively.

2. The multi-node server according to claim 1, wherein the signal transfer circuit board has a middle section, a first adapter, and a second adapter, the middle section connecting the first adapter to the second adapter, a width of the middle section being smaller than a width of the first adapter and the second adapter to form a ventilation recess, a width of the ventilation recess corresponding to the first power input connector and the second power input connector.

3. The multi-node server according to claim 2, wherein the signal transfer circuit board is disposed in an elevation manner above the main circuit board, the first signal connector is disposed on a bottom side of the first adapter, and the second signal connector is disposed on a bottom side of the second adapter.

4. The multi-node server according to claim 3, wherein the first signal connector has a plug-in side, the second signal connector has another plug-in side, the plug-in side of the first signal connector faces the first node area, and the plug-in side of the second signal connector faces the second node area.

5. The multi-node server according to claim 1, wherein the power delivery circuit board is located between the first signal connector and the second signal connector.

6. The multi-node server according to claim 1, wherein the first power input connector faces away from the first node area and is configured to be connected to a first power supply, and the second power input connector faces away from the second node area and is configured to be connected to a second power supply.

7. The multi-node server according to claim 1, wherein the second side of the power delivery circuit board further includes a first identification connector and a second identification connector.

8. The multi-node server according to claim 7, wherein the second side of the power delivery circuit board further includes a first alignment device and a second alignment device.

9. The multi-node server according to claim 8, wherein the first identification connector is located between the first alignment device and the first power input connector, and wherein the second identification connector is located between the second alignment device and the second power input connector.

10. The multi-node server according to claim 8, wherein the power delivery circuit board has a top edge formed by a middle fixing portion, a first side fixing portion, and a second side fixing portion, and the middle fixing portion is located between the first side fixing portion and the second side fixing portion, so as to form a ventilation recess on each side of the middle fixing portion.

11. The multi-node server according to claim 1, further comprising an air deflector located on an outside of the first power input connector and the second power input connector, the air deflector including a curved portion and a pair of side panels, and the pair of side panels being connected to two sides of the curved portion.

12. A multi-node server, comprising: a server chassis; a main circuit board disposed in the server chassis, the main circuit board having a first node area and a second node area; a power delivery circuit board disposed vertically on the main circuit board, a first side of the power delivery circuit board having a first power input connector and a second power input connector; a second side of the power delivery circuit board has a first power output connector and a second power output connector, the second side facing the first side, the first power output connector facing the first node area, and the second power output connector facing the second node area; and a signal transfer module including a signal transfer circuit board, a first signal connector, and a second signal connector, the signal transfer circuit board being disposed in a direction parallel to the main circuit board, and the signal transfer circuit board electrically connecting the first signal connector to the second signal connector; wherein the signal transfer circuit board has a middle section, a first adapter, and a second adapter, the middle section connecting the first adapter to the second adapter, a width of the middle section being smaller than a width of the first adapter and the second adapter to form a ventilation recess, a width of the ventilation recess corresponding to the first power input connector and the second power input connector which facilitates cooling airflow.

13. A multi-node server, comprising:

a server chassis;

a main circuit board disposed in the server chassis, the main circuit board having a first node area and a second node area;

a power delivery circuit board disposed vertically on the main circuit board, a first side of the power delivery circuit board having a first power input connector and a second power input connector;

a second side of the power delivery circuit board has a first power output connector and a second power output connector, the second side facing the first side, the first power output connector facing the first node area, and the second power output connector facing the second node area; and a signal transfer module including a signal transfer circuit board, a first signal connector, and a second signal connector, the signal transfer circuit board being disposed in a direction parallel to the main circuit board, and the signal transfer circuit board electrically connecting the first signal connector to the second signal connector;

wherein the second side of the power delivery circuit board further includes a first identification connector, a second identification connector, a first alignment device and a second alignment device; the first identification connector is located between the first alignment device and the first power input connector, and the second identification connector is located between the second alignment device and the second power input connector.

* * * * *